(12) United States Patent
Chen et al.

(10) Patent No.: US 6,870,752 B2
(45) Date of Patent: Mar. 22, 2005

(54) HIGH DENSITY MASK ROM HAVING FLAT-TYPE BANK SELECT

(75) Inventors: Jing-Wen Chen, Hsin-Chu (TW); Ful-Long Ni, Hsin-Chu (TW); Nien-Chao Yang, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 21 days.

(21) Appl. No.: 10/420,949

(22) Filed: Apr. 23, 2003

(65) Prior Publication Data

US 2003/0235096 A1 Dec. 25, 2003

Related U.S. Application Data

(63) Continuation-in-part of application No. 09/930,306, filed on Aug. 16, 2001, now abandoned.

(51) Int. Cl.$^7$ .............................................. G11C 17/00
(52) U.S. Cl. ............................. 365/104; 365/52; 365/63
(58) Field of Search ........................... 365/52, 63, 104, 365/94, 103, 230.03

(56) References Cited

U.S. PATENT DOCUMENTS

| | | | | |
|---|---|---|---|---|
| 5,909,405 A | * | 6/1999 | Lee et al. | 365/230.03 |
| 6,072,734 A | * | 6/2000 | Choi | 365/194 |
| 6,084,794 A | * | 7/2000 | Lu et al. | 365/104 |
| 6,088,277 A | * | 7/2000 | Kim et al. | 365/207 |
| 6,333,867 B1 | * | 12/2001 | Suzuki et al. | 365/63 |
| 6,621,756 B2 | * | 9/2003 | Lin et al. | 365/230.03 |

* cited by examiner

*Primary Examiner*—Gene N Auduong

(57) ABSTRACT

The present invention provides a read-only memory array having a flat-type structure. The read-only memory array comprises at least two memory banks having a plurality of memory cells. At least two inter-bank transistors are coupled to the two memory banks and shared by the two memory banks. Each inter-bank transistor is used for enabling to select the memory cells of the two memory banks. At least a contact commonly is coupled to the two memory banks through the two inter-bank transistors.

19 Claims, 5 Drawing Sheets

HIGH DENSITY MASK ROM HAVING FLAT-TYPE BANK SELECT

RELATED APPLICATIONS

This application is a Continuation-in-Part of application Ser. No. 09/930,306, filed Aug. 16, 2001 now abandoned.

BACKGROUND OF THE INVENTION

1. Field of the Invention

The invention relates to mask read-only memory, and more particularly to mask read-only memory having flat-type bank select.

2. Description of the Prior Art

There are several read-only memory (ROM) cell structures are well known in application. One approach is referred to as the flat-type ROM design. With the requirement of better memory cell efficiency, the cell pitch and bank height become the key factor to be considered. While the memory cell is shrinking down, the contact size and metal pitch become the limit of it. On the other hand, memory array used to use LOCOS-type MOS for the bank selection transistors, which causes difficulties in the reduction of the layout area.

Memory devices with flat-type ROM design are well documented. For example, a prior technique is illustrated in U.S. Pat. No. 5,117,389 of Yiu, entitled "Flat-Cell Read-Only-Memory Integrated Circuit". Shown in FIG. 1, the number of bank selection transistors utilized is reduced in a memory array, and the metal lines are shared between even and odd banks. Access to the metal lines is made through a plurality of LOCOS bank selection transistors connected to every other buried diffusion. By using this architecture, the metal lines are running parallel to the buried diffusion lines. A block select transistor ($BWL_N$), word select transistor ($SWL_N$), bank left select transistor ($SBL_N$) and a bank right select transistor ($SBR_N$) are required to access a ROM cell. Contacts are made for connecting them by using isolated bank selection transistors. The alternate buried diffusion bit lines are connected through either a buried diffusion region to its left or a buried diffusion region to its right to the metal lines, by means of left-right bit selection transistors. One disadvantage of the ROM design of Yiu is the number of transistor required to access the ROM cell, which affects the overall size of the array. Other peripheral circuits also contribute to the overall array size.

Another design is U.S. Pat. No. 5,621,697 of Weng et al., entitled in "High Density Integrated Circuit with Bank Select Structure". In this design, the bank selection structure includes bank selection transistors which are located and oriented adjacent diffusion bit lines and intrabank diffusion bit lines. Each intrabank bit lines of a bank extends into neighboring banks either above or below the bank. Interbank bit lines provide reducing the number of bank selection transistors. To improve the vertical pitch, the bank selection transistors are coupled to the metal lines by metal-to-diffusion region contacts.

Therefore, it is desirable to design a high performance ROM that can be manufactured with high yield. It is also desirable to utilize straight metal bit lines to simplify manufacture and increase circuit efficiency. It is also desirable to minimize the number of transistors in an array in order to optimize speed, size, power consumption and ease of fabrication parameters. Furthermore, for reduction of layout area and flexible fabrication, the contact number should be reduced and the metal pitch should be released.

SUMMARY OF THE INVENTION

It is one object of the present invention to provide an architecture of a flat-type ROM. The contact and transistor numbers can be reduced, which can further reduce the effect of the metal coupling and have larger cell current.

It is another object of the present invention to provide a structure of a flat-type ROM. The area of the bank layout can be compact in both horizontal and vertical directions, and the metal pitch can be released.

It is another object of the present invention to provide a compact structure of a memory array. The bank selection lines are shared between adjacent two bank arrays, which can reduce the area of the memory array.

The present invention provides a read-only memory array having a flat-type structure. The read-only memory array comprises at least two memory banks having a plurality of memory cells. At least two inter-bank transistors are coupled to the two memory banks and shared by the two memory banks. Each inter-bank transistor is used for enabling to select the memory cells of the two memory banks. At least a contact commonly is coupled to the two memory banks through the two inter-bank transistors.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

Figure 1:
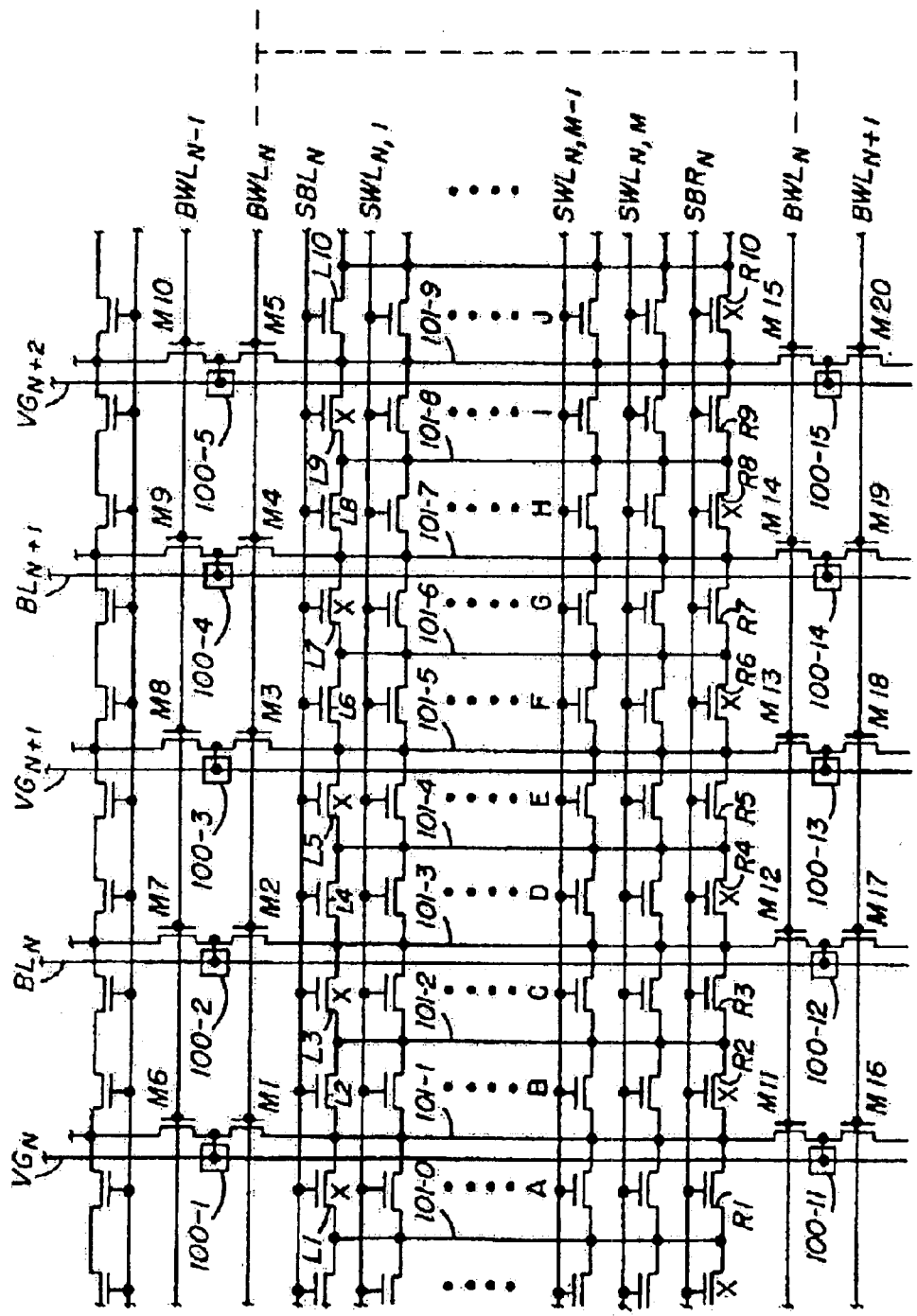
FIG. 1 is a circuit diagram of a bank array of a read-only memory in accordance with the prior art.

While the invention is particularly shown and described with reference to the following preferred embodiment, it will be understood by those skilled in the art that many other modifications and variations may be made thereto without departing from the broader spirit and scope of the invention as set forth in the claims. Use of the disclosed structure or method is not limited to mask read-only memory device, but may also be used in fabricating other types of memory devices with equal architectures. The specification and drawings are according to be regarded as being illustrative, rather than being restrictive.

Furthermore, there is shown a representative portion of a semiconductor structure of the present invention in enlarged. The drawings are not necessarily to scale, as the thickness of the various layers are shown for clarify of illustration and should not be interpreted in a limiting sense. Accordingly, these regions will have dimensions, including length, width and depth, when fabricated in an actual device.

In the present invention, a read-only memory array has a flat-type structure comprising at least two memory banks having a plurality of memory cells. At least two inter-bank transistors are coupled to the two memory banks and shared by the two memory banks. Each inter-bank transistor is used for enabling to select the memory cells of the two memory banks. At least two intra-bank transistors are which each intra-bank transistor is coupled to any one of the two memory banks. At least a contact is commonly coupled to the two memory banks through the two inter-bank transistors and the intra-bank transistors.

The bank array architecture of a memory cell array containing bank selection structure is disclosed in the present invention. The first embodiment shown in FIG. 2, a first plurality of memory cells MA1, MA2, MA3, MA4, are connected in parallel to a second plurality of memory cells MB1, MB2, MB3, MB4, and a third plurality of memory cells MC1, MC2, MC3, MC4. Each memory cell of the first, second and third plurality of memory cells is coupled to two adjacent lines constituting a memory bank (herein named first memory bank). A memory array consisting of a plurality of memory banks. Furthermore, with their individual gate terminals, the memory cells MA1 to MA4 are commonly connected to corresponding word line WL0. Similarly, the gate terminals of the memory cells MB1 to MB4 are commonly connected to corresponding word line WL1, and those of the memory cells MC1 to MC4 are commonly connected to corresponding word line WL2.

On the other hand, an adjacent memory bank (herein named second memory bank) comprises a first plurality of memory cells MA1', MA2', MA3', MA4', connected in parallel to a second plurality of memory cells MB1', MB2', MB3', MB4', and a third plurality of memory cells MC1', MC2', MC3', MC4'. Furthermore, with their individual gate terminals, the memory cells MA1' to MA4' are commonly connected to corresponding word line WL0'. Similarly, the gate terminals of the memory cells MB1' to MB4' are commonly connected to corresponding word line WL1', and those of the memory cells MC1' to MC4' are commonly connected to corresponding word line WL2'.

Furthermore, an inter-bank selection transistor MS1 is connected to a bank selection line BS0 through the gate terminal thereof. Another inter-bank selection transistor MS0 is connected to another bank selection line BS1 through the gate terminal thereof. In the present invention, the bank selection lines BS0 and BS1 are shared among adjacent memory banks. That is, the bank selection lines BS0 and BS1 can be selected for the memory cells of the first and second memory banks.

The metal bit line S1 is connected to the inter-bank selection transistors MS0 and MS1 through a contact 10. In the present invention, one metal bit line S1 is at least coupled to the first terminal, such as a drain or source, of the inter-bank selection transistor MS0 and the second terminal, such as a source or drain, of the inter-bank selection transistor MS1 through one contact 10. The second terminal of inter-bank selection transistor MS0 is commonly connected to the memory cells of the first memory bank through a sub bit line SB1 and the memory cells of the second memory bank through sub bit line SB2'. Similarly, the first terminal of the inter-bank selection transistor MS1 is commonly connected to the memory cells of the first memory bank through a sub bit line SB3 and the memory cells of the second memory bank through sub bit line SB4'. That is, the first terminals of the memory cells MA1, MB1, and MC1, and the second terminals of the memory cells MA2, MB2, and MC2 are coupled to the metal bit line S1 through sub bit line SB1. The first terminals of the memory cells MA2, MB2, and MC2, and the second terminals of the memory cells MA3, MB3, and MC3 are coupled downward to another metal bit line (not shown) through sub bit line SB2. The first terminals of the memory cells MA3, MB3, and MC3, and the second terminals of the memory cells MA4, MB4, and MC4 are coupled to the metal bit line S1 through sub bit line SB3. The first terminals of the memory cells MA4, MB4, and MC4 are coupled downward to another metal bit line (not shown) through sub bit line SB4.

Similarly, the first terminals of the memory cells MA1', MB1', and MC1', and the second terminals of the memory cells MA2', MB2', and MC2' are coupled upward to another metal bit line (not shown) through sub bit line SB1'. The first terminals of the memory cells MA2', MB2', and MC2', and the second terminals of the memory cells MA3', MB3', and MC3' are coupled downward to the metal bit line S1 through sub bit line SB2'. The first terminals of the memory cells MA3', MB3', and MC3', and the second terminals of the memory cells MA4', MB4', and MC4' are coupled upward to another metal bit line (not shown) through sub bit line SB3'. The first terminals of the memory cells MA4', MB4', and MC4' are coupled to the metal bit line S1 through sub bit line SB4'. Thus, the metal bit line S1 of the present invention through two inter-bank selection transistors (MS0 and MS1) with the contact 10 can coordinate with four buried diffusion regions (that is, SB1, SB2', SB3, and SB4').

Accordingly, the memory cells MA1, MA2, MB1, MB2, MC1, and MC2 are individually selected by the inter-bank selection transistor MS0 through the sub bit line SB1. The memory cells MA2', MA3', MB2', MB3', MC2', and MC3' are individually selected by the inter-bank selection transistor MS0 through the sub bit line SB2'. The memory cells MA3, MA4, MB3, MB4, MC3, and MC4 are individually selected by the inter-bank selection transistor MS1 through the sub bit line SB3. The memory cells MA4', MB4', and MC4' are individually selected by the inter-bank selection transistor MS1 through the sub bit line SB4'. All memory cells of other memory banks can be selected following the above configuration. There are many advantages on using the configuration. First, the bank selection lines are shared between adjacent two memory banks, which reduces the layout area of the bank selection area along vertical direction. Second, each contact is only connected to two inter-bank selection transistors instead of four ones of the prior art, which reduces the amount of the transistors. Furthermore, the configuration can be implemented by the general processes without extra specific ones. Third, the amount of transistors is reduced when current passes through, which can reduce work voltage. Fourth, the amount reduction of the metal contacts can reduce metal coupling.

Figure 2:
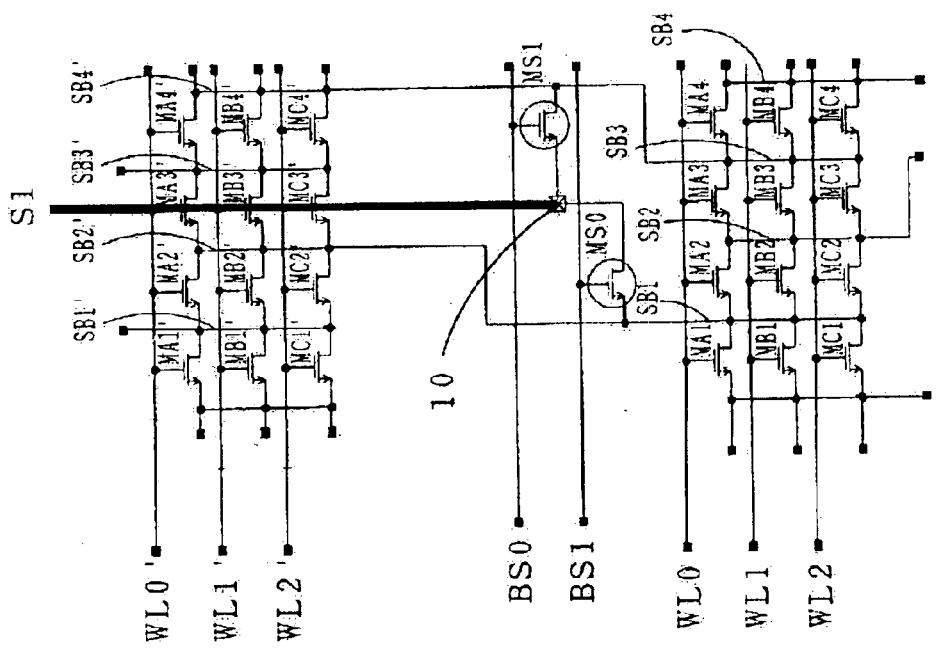
FIG. 2 is a circuit diagram of a bank array of a read-only memory illustrating the layout representation of a preferred embodiment in accordance with the present invention.
Figure 3:
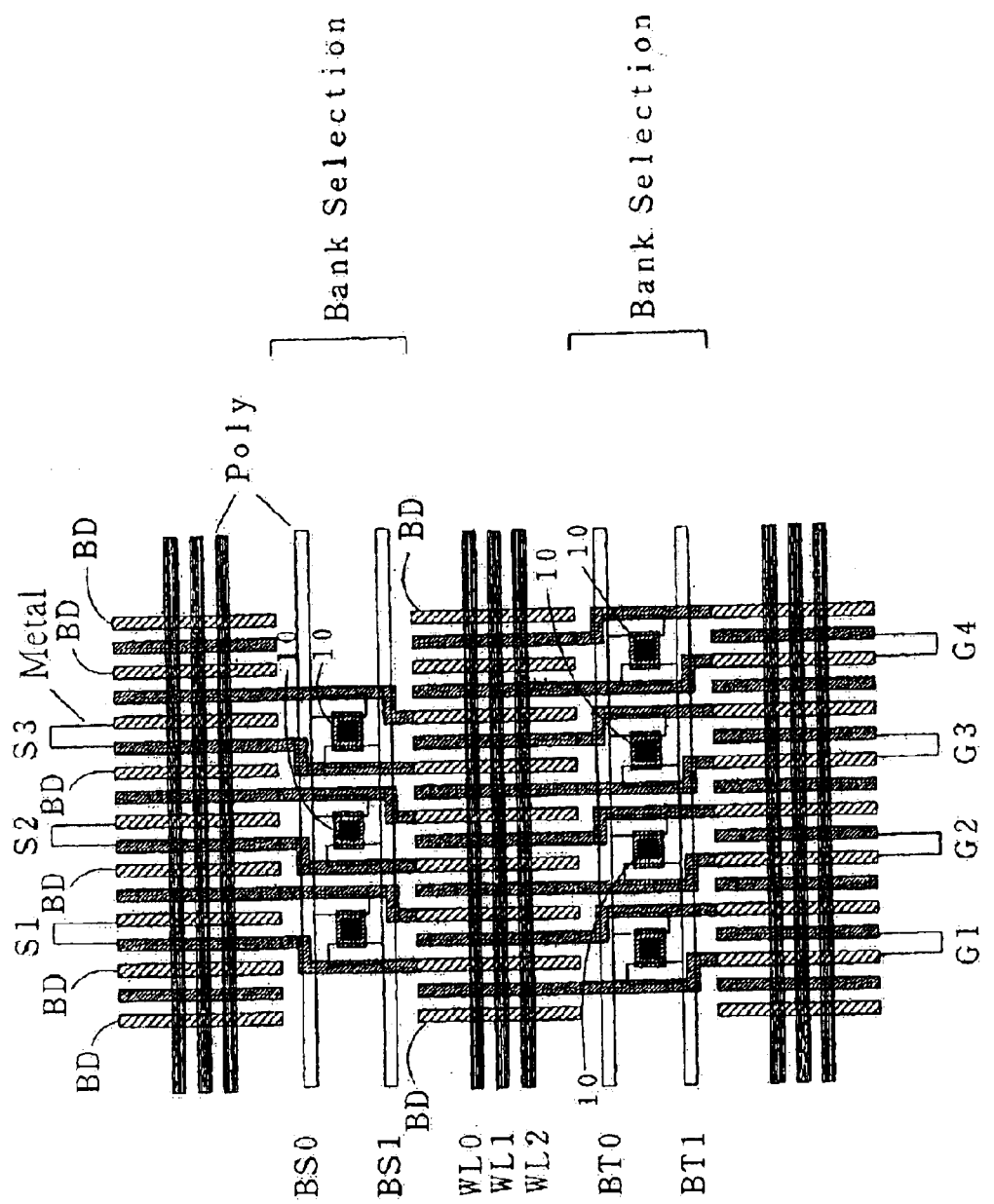
FIG. 3 is the plan view of the layout of FIG. 2.

The equivalent layout of the architecture of FIG. 2 is represented in FIG. 3. The source and drain regions of the memory cells are formed by crossing word lines (WL0, WL1, WL2) and buried diffusions (BDs). To connect buried diffusion in each bank to metal bit/ground lines (S1, S2, S3, G1, G2, G3, G4, etc.), bank selection lines BS0, BS1, BT0 and BT1 made of polysilicon go across these extended buried diffusions BD to form inter-bank selection transistors MS0, MS1 of FIG. 2, etc. Furthermore, metal bit lines S1, S2, S3 and metal ground lines G1, G2, G3, G4, are also directly connected to the buried diffusions BD by contacts 10. Thus, each metal bit line can be coupled to at least four buried diffusions BD through two inter-bank selection transistors.

Figure 4:
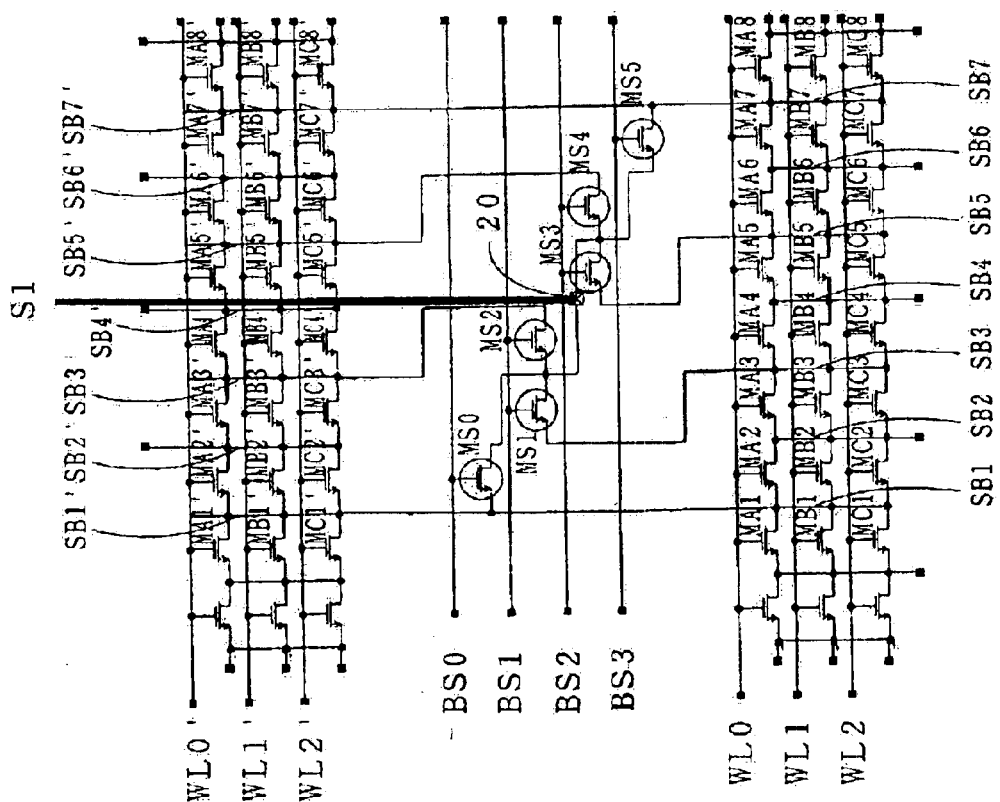
FIG. 4 is another circuit diagram of the bank array of a read-only memory illustrating the layout representation of the other preferred embodiment in accordance with the present invention.

The second embodiment shown in FIG. 4 illustrates the amount reduction of the contact number and pitch release of metal contact in the present invention. In the second embodiment, the metal bit line S1 is coupled to two inter-bank selection transistors MS0 and MS5, and four intra-bank selection transistors MS1, MS2, MS3, and MS4 through a contact 20. Similar to FIG. 2, the gate terminal of inter-bank selection transistor MS0 is connected to bank selection line BS0. The individual gate terminals of intra-bank selection transistors MS1 and MS2 are commonly connected to bank selection line BS1. The individual gate terminals of intra-bank selection transistors MS3 and MS4 are commonly connected to bank selection line BS2. The gate terminal of inter-bank selection transistor MS5 is connected to bank selection line BS3. The metal bit line S1 is connected to second or first terminals of the intra-bank and inter-bank selection transistors MS0 to MS5. In the embodiment, the individual first terminals of inter-bank selection transistors MS0, intra-bank selection transistors MS1, MS3, and the individual second terminals of intra-bank selection transistors MS2, MS4, inter-bank selection transistor MS5, are commonly connected to the metal bit line S1.

The second terminal of inter-bank selection transistor MS0 is commonly connected to both the memory cells of one memory bank through a sub bit line SB1 and the memory cells of the other memory bank through sub bit line SB1'. Similarly, the first terminal of the inter-bank selection transistor MS5 is commonly connected to the memory cells of the one memory bank through a sub bit line SB7 and the memory cells of the other memory bank through sub bit line SB7'. That is, the first terminals of the memory cells MA1, MB1, and MC1, and the second terminals of the memory cells MA2, MB2, and MC2 are coupled to the metal bit line S1 with the inter-bank selection transistor MS0 through sub bit line SB1. The first terminals of the memory cells MA1', MB1', and MC1', and the second terminals of the memory cells MA2', MB2', and MC2' are coupled to the metal bit line S1 with the inter-bank selection transistor MS0 through sub bit line SB1'. The first terminals of the memory cells MA7, MB7, and MC7, and the second terminals of the memory cells MA8, MB8, and MC8 are coupled to the metal bit line S1 with the inter-bank selection transistor MS5 through sub bit line SB7. The first terminals of the memory cells MA7', MB7', and MC7', and the second terminals of the memory cells MA8', MB8', and MC8' are coupled to the metal bit line S1 with the inter-bank selection transistor MS5 through sub bit line SB7'.

On the other hand, the intra-bank selection transistor MS1, MS2, MS3, or MS4 is coupled to the memory cells of one memory bank. In the embodiment, the first terminals of the memory cells MA2, MB2, and MC2, and the second terminals of the memory cells MA3, MB3, and MC3 are coupled downward to another metal bit line (not shown) through sub bit line SB2. The first terminals of the memory cells MA3, MB3, and MC3, and the second terminals of the memory cells MA4, MB4, and MC4 are coupled to the metal bit line S1 with the intra-bank selection transistor MS1 through sub bit line SB3. The first terminals of the memory cells MA4, MB4, and MC4, and the second terminals of the memory cells MA5, MB5, MC5 are coupled downward to another metal bit line (not shown) through sub bit line SB4. The first terminals of the memory cells MA5, MB5, and MC5, and the second terminals of the memory cells MA6, MB6, and MC6 are coupled to the metal bit line S1 with the intra-bank selection transistor MS3 through sub bit line SB5. The first terminals of the memory cells MA6, MB6, and MC6 and the second terminals of the memory cells MA7, MB7, MC7 are coupled downward to another metal bit line (not shown) through sub bit line SB6.

Similarly, the first terminals of the memory cells MA2', MB2', and MC2', and the second terminals of the memory cells MA3', MB3', and MC3' are coupled upward to another metal bit line (not shown) through sub bit line SB2'. The first terminals of the memory cells MA3', MB3', and MC3', and the second terminals of the memory cells MA4', MB4', and MC4' are coupled to the metal bit line S1 with the intra-bank selection transistor MS2 through sub bit line SB3'. The first terminals of the memory cells MA4', MB4', and MC4', and the second terminals of the memory cells MA5', MB5', MC5' are coupled upward to another metal bit line (not shown) through sub bit line SB4'. The first terminals of the memory cells MA5', MB5', and MC5', and the second terminals of the memory cells MA6', MB6', and MC6' are coupled to the metal bit line S1 with the intra-bank selection transistor MS4 through sub bit line SB5'. The first terminals of the memory cells MA6', MB6', and MC6' and the second terminals of the memory cells MA7', MB7', MC7' are coupled upward to another metal bit line (not shown) through sub bit line SB6'.

Accordingly, the memory cells MA1, MA2, MB1, MB2, MC1, and MC2 are individually selected by the inter-bank selection transistor MS0 through the sub bit line SB1. The memory cells MA1', MA2', MB1', MB2', MC1', and MC2' are individually selected by the inter-bank selection transistor MS0 through the sub bit line SB1'. The memory cells MA3, MA4, MB3, MB4, MC3, and MC4 are individually selected by the intra-bank selection transistor MS1 through the sub bit line SB3. The memory cells MA3', MA4', MB3', MB4', MC3', and MC4' are individually selected by the intra-bank selection transistor MS2 through the sub bit line SB3'. The memory cells MA5, MA6, MB5, MB6, MC5, and MC6 are individually selected by the intra-bank selection transistor MS3 through the sub bit line SB5. The memory cells MA5', MA6', MB5', MB6', MC5', and MC6' are individually selected by the intra-bank selection transistor MS4 through the sub bit line SB5'. The memory cells MA7, MA8, MB7, MB8, MC7, and MC8 are individually selected by the inter-bank selection transistor MS5 through the sub bit line SB7. The memory cells MA7', MA8', MB7', MB8', MC7', and MC8' are individually selected by the inter-bank selection transistor MS5 through the sub bit line SB7'. All memory cells of other memory banks can be selected following the above configuration. In the embodiment, the bank selection features one bit line or one ground line connected to every 8 sub bit line of the array. Also, in the embodiment, the layout structure features one metal contact for every 8 buried diffusions (sub bit lines), which is half amount of metal contacts compared with one in a conventional layout design. The release of metal pitch makes it easy in flexible layout design and is good for shrinking down to the next generation. The released metal line pitch also reduces the effect of metal coupling among them, and it will be healthy for reading data.

Figure 5:
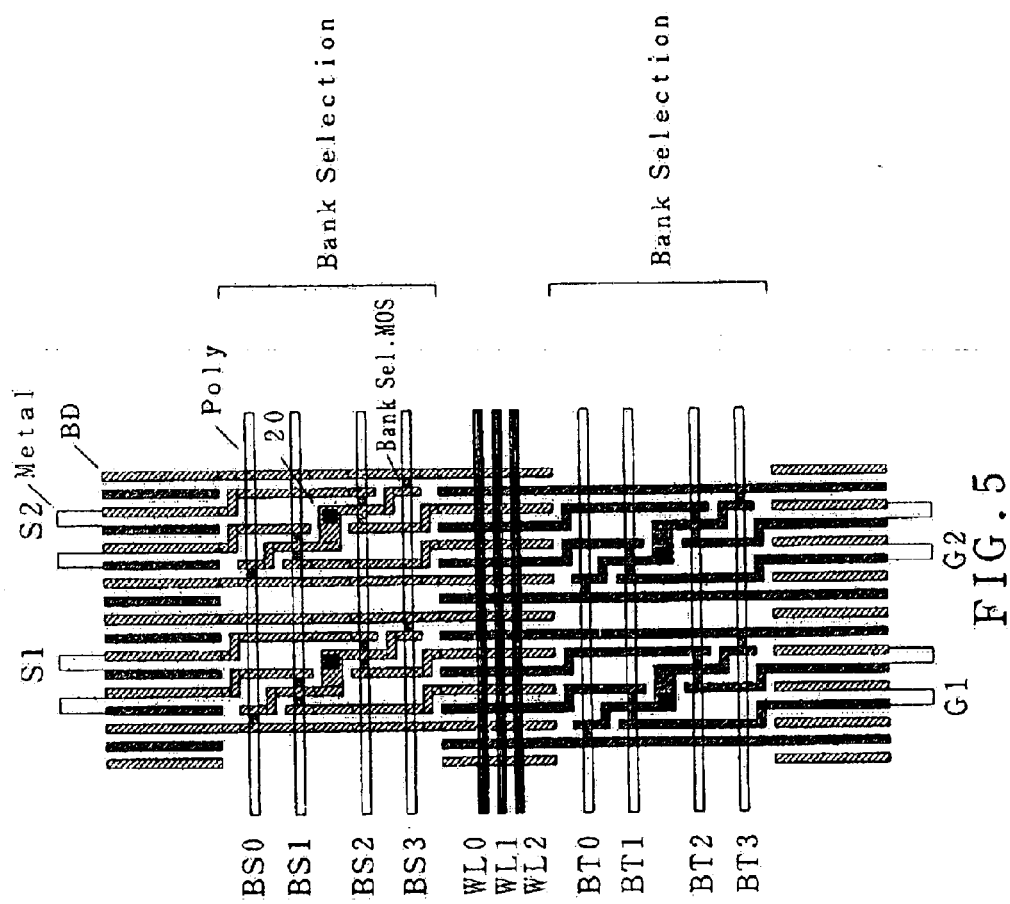
FIG. 5 is the plan view of the layout of FIG. 4.

The equivalent layout of the architecture of FIG. 4 is represented in FIG. 5. Each contact 20 is connected to the source or drain regions of the inter/intra-bank selection transistors, for example, MS0 to MS5 of FIG. 4. The source and drain regions of the memory cells are formed by crossing word lines (WL0, WL1, WL2) and buried diffusions (BDs). To connect buried diffusion in each memory bank to metal bit/ground lines (S1, S2, G1, G2, etc.), bank selection lines BS0 to BS3, BT0 to BT3 made of polysilicon go across these extended buried diffusions BD to form inter/intra-bank selection transistors MS0 to MS5 of FIG. 4, etc. Furthermore, metal bit lines S1, S2, and metal ground lines G1, G2, are also directly connected to the buried diffusions BD by contacts 20.

To be specific, the bank selection transistors in the first embodiment can be combined with one in the second embodiment for design requirement. For example, in FIG. 2, while the buried diffusion SB1 and SB3 are coupled to the bank selection transistors of the first embodiment, the buried diffusion SB2 and SB4 are coupled to the bank selection transistors of the second embodiment (not shown as figure).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory array comprising:
   two memory banks, each having a plurality columns of memory cells;
   an inter-bank bitline connecting one of said plurality column of memory cells of each said two memory banks;
   a global bitline connecting to said inter-bank bitline via a selection transistor;
   a ground line connecting to said inter-bank bitline in each said memory bank; and
   a selection line connecting said selection transistor for selectively accessing said memory cells connecting to said inter-bank bitline.

2. The memory array of claim 1, wherein said inter-bank bitline comprises buried diffusion line.

3. A memory array, said memory array comprising:
   a first, second, and third memory banks arranging in column sequentially, each of said memory banks having a plurality columns of memory cells;
   a first inter-bank bitline connecting a first column of memory cells of said first memory bank and a first column of memory cells of said second memory bank;
   a second inter-bank bitline connecting a first column of memory cells of said third memory bank and a second column of memory cells of said second memory bank;
   a first global bitline coupling to said first inter-bank bitline via a first selection transistor;
   a second global bitline coupling to said second inter-bank bitline via a second selection transistor;
   a first selection line connecting said first selection transistor for selectively accessing said memory cells connecting to said first inter-bank bitline;
   a second selection line connecting said second selection transistor for selectively accessing said memory cells connecting to said second inter-bank bitline; and
   a ground line connecting to said first inter-bank bitline and to said second inter-bank bitline in each said memory bank.

4. The memory array of claim 3, wherein said first and second inter-bank bitlines comprise buried diffusion lines.

5. The memory array of claim 3, wherein said first column and said second column of memory cells of said second memory banks are adjacent to each other.

6. A memory array, said memory array comprising:
   a first and second memory banks arranging in column sequentially, each of said memory banks having a plurality columns of memory cells;
   a first inter-bank bitline connecting a first column of memory cells of said first memory bank and a first column of memory cells of said second memory bank;
   a second inter-bank bitline connecting a second column of memory cells of said first memory bank and a second column of memory cells of said second memory bank;
   a global bitline coupling to said first inter-bank bitline via a first selection transistor and to said second inter-bank bitline via a second selection transistor;
   a first selection line connecting said first selection transistor for selectively accessing said memory cells connecting to said first inter-bank bitline via said global bitline;
   a second selection line connecting said second selection transistor for selectively accessing said memory cells connecting to said second inter-bank bitline via global bitline; and
   a ground line connecting to said first inter-bank bitline and to said second inter-bank bitline in said first and said second memory banks.

7. The memory array of claim 6, wherein said first and second inter-bank bitlines comprise buried diffusion lines.

8. A memory array, said memory array comprising:
   two memory banks, each having a plurality columns of memory cells;
   two inter-bank selection transistors coupling to said two memory banks, each said two inter-bank selection transistor for enabling to select said plurality columns of said memory cells of said two memory banks;
   two intra-bank selection transistors, each said two intra-bank selection transistor coupling to only one of said two memory banks;
   a metal line coupling to said two inter-bank selection transistor, and to said two inter-bank selection transistor through a contact;
   a gate terminal of each said two inter-bank selection transistor connecting to each said two bank selection line;
   four gate terminals of intra-bank selection transistors, wherein said two of said four gate terminals of intra-bank selection transistors commonly connecting to each said two bank selection lines; and
   a first terminals and a second terminals of said plurality columns of said memory cells coupling to said metal bit line with said two inter-bank selection transistor through a sub bit line, and said first terminal and said second terminal of said plurality columns of said memory cells coupling to each said metal bit line with said intra-bank selection transistor through said sub bit line.

9. The memory array of claim 8, wherein each said memory bank is coupled to each said at least two inter-bank selection transistor through at least a buried diffusion region that is coupled to partial said plurality columns of memory cells of each said at least two memory bank.

10. The memory array of claim 8, wherein each said intra-bank selection transistor is coupled to one of said two memory banks whereof at least said buried diffusion region is coupled to partial plurality columns of said memory cells of said at least two memory banks and one said intra-bank selection transistor.

11. The memory array of claim 8, wherein each said inter-bank selection transistor coupled to said buried diffusion region and a second terminal coupled to said contact through a first terminal.

12. The memory array of claim 8, wherein each said intra-bank selection transistor coupled to said buried diffusion region and a second terminal coupled to said contact through a first terminal.

13. The memory array of claim 8, wherein each said memory bank further comprises a plurality of parallel word lines, wherein each said parallel word line is coupled to a plurality of gate terminal of partial said memory cells.

14. The memory array of claim 8, wherein said metal bit line is connected to said individual first terminal of said inter-bank selection transistors.

15. The memory array of claim 8, wherein said metal bit line further connected to said individual second terminal of said intra-bank selection transistors.

16. The memory array of claim 8, wherein said plurality of said memory cells are individually selected by said at least two inter-bank selection transistor through said sub bit line.

17. The memory array of claim 8, wherein said plurality of said memory cells are individually selected by said at least two intra-bank selection transistor through said sub bit line.

18. The memory array of claim 8, wherein said first terminals of said plurality of said memory cells and said second terminals of said plurality columns of said memory cells are coupled downward to another metal bit line through said sub bit line.

19. The memory array of claim 8, wherein said first terminals and said second terminals of said plurality columns of said memory cells coupled upward to another metal bit line through said sub bit line.

* * * * *